United States Patent
Yen et al.

(10) Patent No.: US 9,129,954 B2
(45) Date of Patent: Sep. 8, 2015

(54) SEMICONDUCTOR PACKAGE INCLUDING ANTENNA LAYER AND MANUFACTURING METHOD THEREOF

(71) Applicant: Advanced Semiconductor Engineering, Inc., Kaohsiung (TW)

(72) Inventors: Han-Chee Yen, Taipei (TW); Shih-Yuan Chen, Taipei (TW); Chien-Pai Lai, Hualien (TW); Ming-Hsien Cheng, Taichung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 6 days.

(21) Appl. No.: 13/789,382

(22) Filed: Mar. 7, 2013

(65) Prior Publication Data

US 2014/0252595 A1    Sep. 11, 2014

(51) Int. Cl.
*H01L 23/498* (2006.01)
*H01L 21/56* (2006.01)
(Continued)

(52) U.S. Cl.
CPC ............ *H01L 23/498* (2013.01); *H01L 21/561* (2013.01); *H01L 23/5383* (2013.01); *H01L 23/5389* (2013.01); *H01L 23/552* (2013.01); *H01L 23/66* (2013.01); *H01L 24/97* (2013.01); *H01L 25/16* (2013.01); *H01L 23/49822* (2013.01); *H01L 2223/6677* (2013.01); *H01L 2224/16225* (2013.01); *H01L 2224/97* (2013.01); *H01L 2924/1531* (2013.01); *H01L 2924/15192* (2013.01); *H01L 2924/19105* (2013.01)

(58) Field of Classification Search
CPC ... H01L 23/498; H01L 21/561; H01L 23/552; H01L 23/66; H01L 24/97; H01L 25/16; H01L 2223/6677; H01L 2924/19105; H01L 2224/16225
USPC .................. 257/737, 692, E21.508, E21.505, 257/E23.01, E21.332, 704, 788; 438/122, 438/127
See application file for complete search history.

(56) References Cited

U.S. PATENT DOCUMENTS

| | | | |
|---|---|---|---|
| 4,814,205 A | 3/1989 | Arcilesi et al. | |
| 5,166,772 A | 11/1992 | Soldner et al. | |

(Continued)

FOREIGN PATENT DOCUMENTS

| | | |
|---|---|---|
| JP | 08-288686 | 1/1996 |
| WO | WO2004060034 | 7/2004 |

OTHER PUBLICATIONS

Huang et al., "Conformal Shielding Investigation for SiP Modules", 2010 IEEE Electrical Design of Advanced Package & Systems Symposium (Dec. 2010).

*Primary Examiner* — Thinh T Nguyen
(74) *Attorney, Agent, or Firm* — Foley & Lardner LLP; Cliff Z. Liu; Angela D. Murch

(57) ABSTRACT

A semiconductor package and a manufacturing method thereof are provided. The semiconductor package includes a substrate, a semiconductor chip, a package body and an antenna layer. The semiconductor chip is disposed on the substrate. The package body encapsulates the semiconductor chip and includes an upper surface. The antenna layer is formed on the upper surface of the package body and includes two antenna slot groups connected together. Each antenna slot group includes a wave guiding slot extending along a first direction, and an irradiation slot group extending along a second direction, wherein the irradiation slot group is connected to the wave guiding slot.

21 Claims, 16 Drawing Sheets

(51) Int. Cl.
*H01L 23/552* (2006.01)
*H01L 23/66* (2006.01)
*H01L 23/00* (2006.01)
*H01L 25/16* (2006.01)
*H01L 23/538* (2006.01)

(56) References Cited

U.S. PATENT DOCUMENTS

| | | | |
|---|---|---|---|
| 5,353,498 A | 10/1994 | Fillion et al. | |
| 5,355,016 A | 10/1994 | Swirbel et al. | |
| 5,557,142 A | 9/1996 | Gilmore et al. | |
| 5,639,989 A | 6/1997 | Higgins, III | |
| 5,677,511 A | 10/1997 | Taylor et al. | |
| 5,694,300 A | 12/1997 | Mattei et al. | |
| 5,776,798 A | 7/1998 | Quan et al. | |
| 5,886,876 A | 3/1999 | Yamaguchi | |
| 5,895,229 A | 4/1999 | Carney et al. | |
| 5,998,867 A | 12/1999 | Jensen et al. | |
| 6,093,972 A | 7/2000 | Carney et al. | |
| 6,150,193 A | 11/2000 | Glenn | |
| 6,225,694 B1 | 5/2001 | Terui | |
| 6,614,102 B1 | 9/2003 | Hoffman et al. | |
| 6,686,649 B1 | 2/2004 | Mathews et al. | |
| 6,740,959 B2 | 5/2004 | Alcoe et al. | |
| 6,757,181 B1 | 6/2004 | Villanueva et al. | |
| 6,781,231 B2 | 8/2004 | Minervini | |
| 6,828,556 B2 * | 12/2004 | Pobanz et al. | 250/336.1 |
| 6,865,084 B2 | 3/2005 | Lin et al. | |
| 6,881,896 B2 | 4/2005 | Ebihara | |
| 6,917,526 B2 | 7/2005 | Ajioka et al. | |
| 6,962,869 B1 | 11/2005 | Bao et al. | |
| 6,998,532 B2 | 2/2006 | Kawamoto et al. | |
| 7,030,469 B2 | 4/2006 | Mahadevan et al. | |
| 7,042,398 B2 | 5/2006 | Tang et al. | |
| 7,045,385 B2 | 5/2006 | Kim et al. | |
| 7,049,682 B1 | 5/2006 | Mathews et al. | |
| 7,081,661 B2 | 7/2006 | Takehara et al. | |
| 7,109,410 B2 | 9/2006 | Arnold et al. | |
| 7,125,744 B2 | 10/2006 | Takehara et al. | |
| 7,129,422 B2 | 10/2006 | Arnold | |
| 7,161,252 B2 | 1/2007 | Tsuneoka et al. | |
| 7,180,012 B2 | 2/2007 | Tsuneoka et al. | |
| 7,187,060 B2 | 3/2007 | Usui | |
| 7,214,889 B2 | 5/2007 | Mazurkiewicz | |
| 7,268,736 B1 * | 9/2007 | Tikhov et al. | 343/770 |
| 7,327,015 B2 | 2/2008 | Yang et al. | |
| 7,342,303 B1 | 3/2008 | Berry et al. | |
| 7,451,539 B2 | 11/2008 | Morris et al. | |
| 7,478,474 B2 | 1/2009 | Koga | |
| 7,488,903 B2 | 2/2009 | Kawagishi et al. | |
| 7,504,721 B2 | 3/2009 | Chen et al. | |
| 7,576,415 B2 | 8/2009 | Cha et al. | |
| 7,615,856 B2 | 11/2009 | Sakai et al. | |
| 7,629,674 B1 | 12/2009 | Foster | |
| 7,633,170 B2 | 12/2009 | Yang et al. | |
| 7,633,765 B1 | 12/2009 | Scanlan et al. | |
| 7,656,047 B2 | 2/2010 | Yang et al. | |
| 7,700,411 B2 | 4/2010 | Yang et al. | |
| 7,745,910 B1 | 6/2010 | Olson et al. | |
| 7,808,439 B2 | 10/2010 | Yang et al. | |
| 7,829,981 B2 | 11/2010 | Hsu | |
| 7,851,893 B2 | 12/2010 | Kim et al. | |
| 7,872,343 B1 | 1/2011 | Berry | |
| 7,944,038 B2 | 5/2011 | Chiu et al. | |
| 7,989,928 B2 | 8/2011 | Liao et al. | |
| 8,018,033 B2 | 9/2011 | Moriya | |
| 8,022,511 B2 | 9/2011 | Chiu et al. | |
| 8,030,750 B2 | 10/2011 | Kim et al. | |
| 8,058,714 B2 | 11/2011 | Noll et al. | |
| 8,061,012 B2 | 11/2011 | Carey et al. | |
| 8,093,690 B2 | 1/2012 | Ko et al. | |
| 8,110,902 B2 | 2/2012 | Eun et al. | |
| 8,186,048 B2 | 5/2012 | Leahy et al. | |
| 8,212,339 B2 | 7/2012 | Liao et al. | |
| 2004/0080463 A1 * | 4/2004 | Jeong | 343/770 |
| 2004/0150097 A1 | 8/2004 | Gaynes et al. | |
| 2005/0029673 A1 | 2/2005 | Naka et al. | |
| 2005/0039946 A1 | 2/2005 | Nakao | |
| 2006/0192714 A1 * | 8/2006 | Koyama et al. | 343/702 |
| 2007/0080878 A1 * | 4/2007 | McLean | 343/725 |
| 2008/0174013 A1 | 7/2008 | Yang et al. | |
| 2009/0000114 A1 | 1/2009 | Rao et al. | |
| 2009/0000815 A1 | 1/2009 | Hiner et al. | |
| 2009/0000816 A1 | 1/2009 | Hiner et al. | |
| 2009/0002969 A1 | 1/2009 | Madsen et al. | |
| 2009/0002971 A1 | 1/2009 | Carey et al. | |
| 2009/0025211 A1 | 1/2009 | Hiner et al. | |
| 2009/0035895 A1 | 2/2009 | Lee et al. | |
| 2009/0102003 A1 | 4/2009 | Vogt et al. | |
| 2009/0102033 A1 | 4/2009 | Raben | |
| 2009/0194851 A1 | 8/2009 | Chiu et al. | |
| 2009/0194852 A1 | 8/2009 | Chiu et al. | |
| 2009/0230487 A1 | 9/2009 | Saitoh et al. | |
| 2009/0256244 A1 | 10/2009 | Liao et al. | |
| 2010/0032815 A1 | 2/2010 | An et al. | |
| 2010/0110656 A1 | 5/2010 | Ko et al. | |
| 2010/0199492 A1 | 8/2010 | Hiner et al. | |
| 2010/0207257 A1 | 8/2010 | Lee | |
| 2011/0115060 A1 | 5/2011 | Chiu et al. | |
| 2011/0127654 A1 | 6/2011 | Weng et al. | |
| 2011/0241969 A1 | 10/2011 | Zhang et al. | |
| 2012/0062439 A1 | 3/2012 | Liao et al. | |
| 2014/0035097 A1 * | 2/2014 | Lin et al. | 257/531 |

* cited by examiner

SEMICONDUCTOR PACKAGE INCLUDING ANTENNA LAYER AND MANUFACTURING METHOD THEREOF

BACKGROUND OF THE INVENTION

1. Field of the Invention

The invention relates in general to a semiconductor package and a manufacturing method thereof, and more particularly to a semiconductor package with an antenna layer and a manufacturing method thereof.

2. Description of the Related Art

Wireless communication devices, such as cell phones, typically include antennas for transmitting and receiving radio frequency (RF) signals. Conventionally, a wireless communication device includes therein an antenna and a communication module, each disposed on different parts of a circuit board. Under the conventional approach, the antenna and the communication module are separately manufactured, and electrically connected together after being placed on the circuit board. Accordingly, manufacturing costs are incurred for both devices. Further, it is difficult to reduce device size to attain compact product design. In addition, an RF signal transmission path between the antenna and the communication module may be long, reducing the quality of a signal transmitted between the antenna and the communication module.

SUMMARY OF THE INVENTION

According to one aspect of this disclosure, a semiconductor package is provided. According to one embodiment, the semiconductor package includes a substrate, a semiconductor chip, a package body and an antenna layer. The semiconductor chip is disposed on an upper surface of the substrate. The package body is disposed adjacent to the upper surface of the substrate and encapsulates the semiconductor chip. The antenna layer is formed on an upper surface of the package body. The antenna layer includes two antenna slot groups connected together. Each antenna slot group includes a wave guiding slot extending along a first direction, and an irradiation slot group extending along a second direction, wherein the irradiation group is connected to the wave guiding slot.

According to another embodiment, a semiconductor package includes a substrate, a semiconductor chip, a first package body, a second package body, and an antenna layer. The semiconductor chip is disposed on the substrate, and the first package body encapsulates the semiconductor chip. The second package body covers the first package body. The antenna layer is formed on the second package body and includes two antenna slot groups. Each antenna slot group includes a wave guiding slot and an irradiation slot group connected to the wave guiding slot.

According to another aspect of this disclosure, a manufacturing method of forming a semiconductor package is provided. According to one embodiment, a substrate is provided. The substrate includes an upper surface and a lower surface opposite to the upper surface. A semiconductor chip is provided, and the semiconductor chip is disposed on the upper surface of the substrate. A package body is formed, wherein the package body encapsulates the semiconductor chip. An antenna layer is formed on an upper surface of the package body, wherein the antenna layer is electrically connected to the semiconductor chip. Two antenna slot groups are formed in the antenna layer. Each antenna slot group includes a wave guiding slot extending along a first direction and an irradiation slot group extending along a second direction, wherein the irradiation slot group is connected to the wave guiding slot.

Figure 1A:
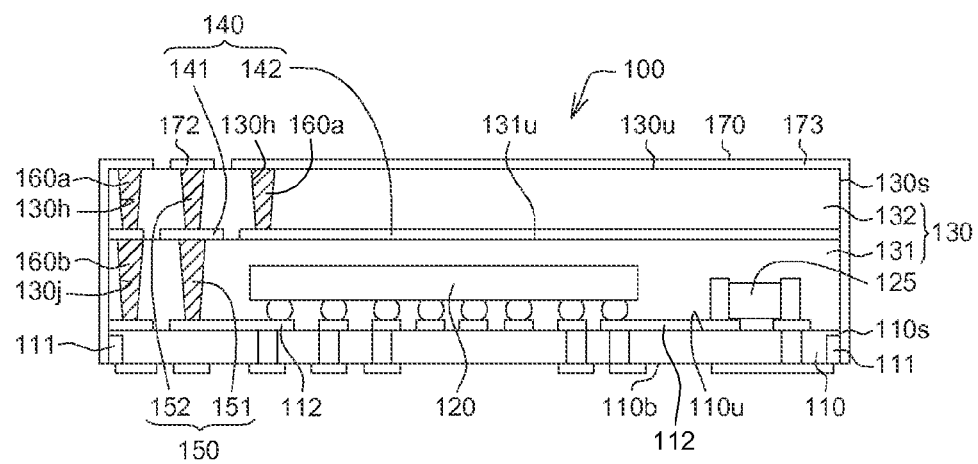
FIG. 1A illustrates a cross-sectional view of an example semiconductor package according to one embodiment.

Common reference numerals are used throughout the drawings and the detailed description to indicate a similarity between features. Embodiments of this disclosure will be more apparent from the following detailed description taken in conjunction with the accompanying drawings.

DETAILED DESCRIPTION OF THE INVENTION

It is desirable to have the benefits of a single semiconductor package including the antenna portion and the communication module portion of a wireless communication device, such as the benefits of reduced package size and shorter RF signal transmission paths. The embodiments disclosed herein provide such a single semiconductor package.

Referring to FIG. 1A, a cross-sectional view of an example semiconductor package 100 according to one embodiment is illustrated. The semiconductor package 100 includes a substrate 110, a semiconductor chip 120, a package body 130, a shielding layer 140, a feeding element 150, a plurality of conductive pillars 160 and an antenna layer 170.

The substrate 110 can be a multi-layered organic substrate or a ceramic substrate, for example. The substrate 110 includes an upper surface 110u, a lower surface 110b opposite to the upper surface 110u and a lateral surface 110s disposed adjacent to a periphery of the substrate 110. The lateral surface 110s extends between the upper surface 110u and the lower surface 110b, and circumscribes the substrate 110. The substrate 110 includes a grounding segment 111. As illustrated in FIG. 1A, the grounding segment 111 partially extends from the lower surface 110b of the substrate 110 towards the upper surface 110u of the substrate 110. In a first alternative embodiment, the grounding segment 111 fully extends from the lower surface 110b of the substrate 110 to the upper surface 110u of the substrate 110, or extends beyond the upper surface 110u. In a second alternative embodiment, the grounding segment 111 partially extends from the upper surface 110u of the substrate 110 to the lower surface 110b of the substrate 110.

The semiconductor chip 120 and a passive component 125 are disposed on the upper surface 110u of the substrate 110 and electrically connected to the substrate 110. For example, the semiconductor chip 120 disposed on the substrate 110 may include a baseband chip. The passive component 125 may be, for example, a resistor, an inductor or a capacitor.

The package body 130 encapsulates the semiconductor chip 120. The package body 130 includes a first package body portion 131 and a second package body portion 132, wherein the first package body portion 131 encapsulates the semiconductor chip 120, and the second package body portion 132 covers the shielding layer 140. In one embodiment, the package body 130 may include material such as novolac-based resin, epoxy-based resin, silicone-based resin or other suitable encapsulant. The package body 130 may also include suitable fillers such as powdered silicon dioxide. The package body 130 can be formed by various packaging technologies, such as, for example, compression molding, injection molding or transfer molding.

The package body 130 includes a lateral surface 130s extending along the periphery of the first package body portion 131, the second package body portion 132 and the shielding layer 140.

The shielding layer 140 is formed on an upper surface 131u of the first package body portion 131 and is covered by the second package body portion 132. The shielding layer 140 may be a single-layered or multi-layered structure. In one embodiment, the shielding layer 140 is a triple-layered structure, in which the middle layer includes copper, and the other layers include stainless steel. In another embodiment, the shielding layer 140 is a double-layered structure, in which one layer includes copper and the other layer includes stainless steel.

The shielding layer 140 includes a feeding portion 141 and a shielding portion 142, wherein the feeding portion 141 is electrically connected to the feeding element 150, and the shielding portion 142 is electrically connected to the grounding segment 111 through the antenna layer 170. The shielding portion 142 is separated from the feeding portion 141. The shielding layer 140 may include aluminum, copper, chromium, tin, gold, silver, nickel, stainless steel or any other suitable metal or alloy.

The feeding element 150 includes a first feeding portion 151 and a second feeding portion 152. The first feeding portion 151 extends through the first package body portion 131 and is electrically connected to the shielding layer 140. Traces 112 are formed on the upper surface 110u of the substrate 110, and electrically connects to the first feeding portion 151 and to the semiconductor chip 120. Accordingly, the feeding element 150 is electrically connected to the semiconductor chip 120. The second feeding portion 152 extends through the second package body portion 132 and is electrically connected to the shielding layer 140.

One or more through holes 130h, such as through molding vias (TMVs), are extended from the antenna layer 170 to the shielding layer 140. The conductive pillars 160a are formed by filling the through holes 130h formed in the package body 130 with conductive material.

One or more through holes 130j, such as TMVs, are extended from the shielding layer 140 to traces 112. The conductive pillars 160b are formed by filling the through holes 130j formed in the package body 130 with conductive material.

The antenna layer 170 is formed on an upper surface 130u and the lateral surface 130s of the package body 130. The antenna layer 170 includes a feeding layer 172 and an irradiation layer 173. The irradiation layer 173 is electrically connected to the grounding segment 111 along the lateral surface 130s of the package body 130. The second feeding portion 152 of the feeding element 150 connects the feeding layer 172 and the feeding portion 141 of the shielding layer 140.

The shielding layer 140 and the antenna layer 170 together form a conformal shielding to protect the semiconductor chip 120 from electromagnetic interference (EMI) negatively affecting the operation of the semiconductor package 100.

The conductive pillars 160a are electrically connected to the grounding segment 111 through the irradiation layer 173 of the antenna layer 170. The conductive pillars 160b are electrically connected to the conductive pillars 160a through the shielding layer 140. Therefore, the conductive pillars 160a and 160b around the feeding element 150 can protect a feeding signal transmitted by the feeding element 150 from EMI.

Figure 1B:
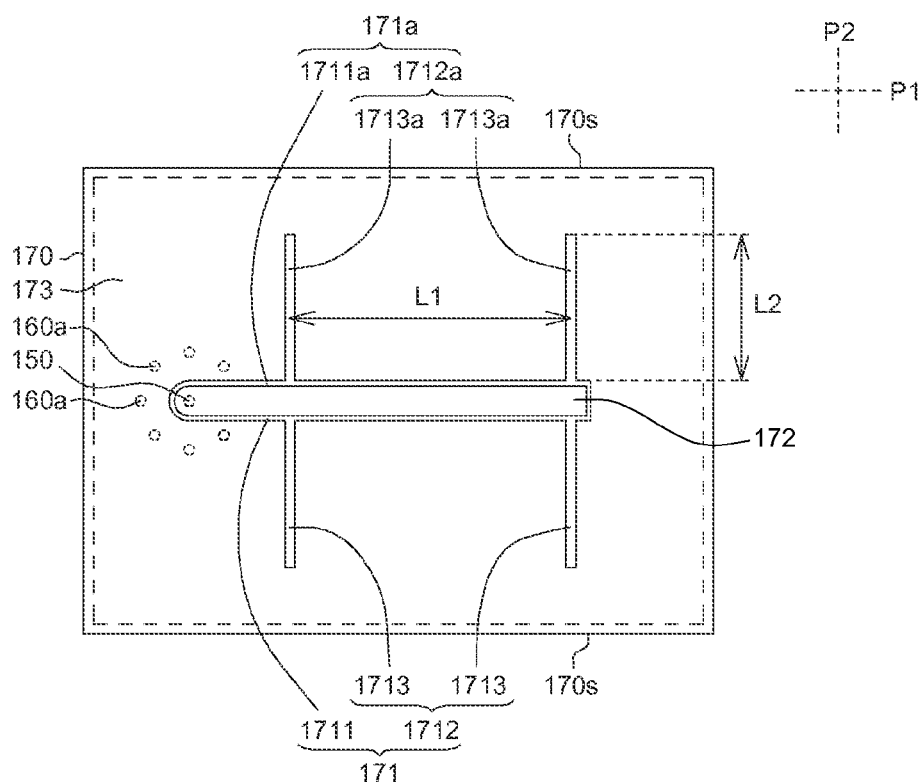
FIG. 1B illustrates a top view of the example of FIG. 1A.

Referring to FIG. 1B, a top view of FIG. 1A is illustrated. The antenna layer 170 includes a lateral surface 170s, and further includes two antenna slot groups 171 and 171a connected together and that form a slot antenna. The two antenna slot groups 171 and 171a are symmetric, and are formed as cuts or indentations in the antenna layer 170. The feeding element 150 is located between the antenna slot groups 171 and 171a for transmitting a feeding signal to the slot antenna.

Antenna slot group 171 includes a wave guiding slot 1711 and an irradiation slot group 1712. The wave guiding slot 1711 is used for transmitting a millimeter wavelength (mmWave) signal. The irradiation slot group 1712 is used for radiating the mmWave signal. The wave guiding slot 1711 extends along a first direction P1, and the irradiation slot group 1712 extends along a second direction P2. The irradiation slot group 1712 is connected to the wave guiding slot 1711. The irradiation slot group 1712 is illustrated as including at least two irradiation slots 1713, but such embodiment is not meant to be limiting. In another embodiment, the number of the irradiation slots 1713 of the irradiation slot group 1712 may be one, or may be more than two. In the embodiment of FIG. 1B, the irradiation slots 1713 are not extended to the lateral surface 170s of the antenna layer 170, but such embodiment is not meant to be limiting. In another embodiment, the irradiation slots 1713 may be extended to the lateral surface 170s of the antenna layer 170.

As illustrated in FIG. 1B, the irradiation slots 1713 are perpendicularly connected to the wave guiding slot 1711. In another embodiment, the irradiation slots 1713 can be slantwise connected to the wave guiding slot 1711 to lengthen the irradiation slots 1713 for radiating more energy of the mmWave signal. The thinner a wave guiding slot 1711 is, the stronger the transmission of the mmWave signal will be. The wave guiding slots 1711 are preferably in the range 50-700 micrometers (μm) wide. In one embodiment, the wave guiding slots 1711 are about 50 μm wide.

The wider an irradiation slot 1713 is, the stronger the irradiation for the mmWave signal will be. Accordingly, for improved radiation of the mmWave signal, the irradiation slots 1713 may be designed to be wider than the wave guiding slot 1711. The irradiation slots 1713 are preferably in the range 50-700 µm wide. In one embodiment, the irradiation slots 1713 are about 100 µm wide.

The antenna slot group 171a is approximately a mirror image of the antenna slot group 171, and thus the above description of the wave guiding slot 1711, the irradiation slot group 1712, and the irradiation slots 1713 similarly applies to the wave guiding slot 1711a, the irradiation slot group 1712a, and the irradiation slots 1713a.

The length L1 of the portion of the wave guiding slot 1711a between the two irradiation slots 1713a determines the wavelength of the mmWave signal, and the length L2 of the irradiation slots 1713a is about half of the wavelength of the mmWave signal. Stated in another way, L2 is approximately half of the L1 in the illustrated embodiment.

The feeding layer 172 of FIG. 1A may function as a coplanar waveguide (CPW) to transmit the mmWave signal to the irradiation slot groups 1712 and 1712a.

The irradiation layer 173 of FIG. 1A is separated from the feeding layer 172 by the wave guiding slots 1711 and 1711a to avoid negatively affecting a feeding signal in the feeding element 150.

Figure 2A:
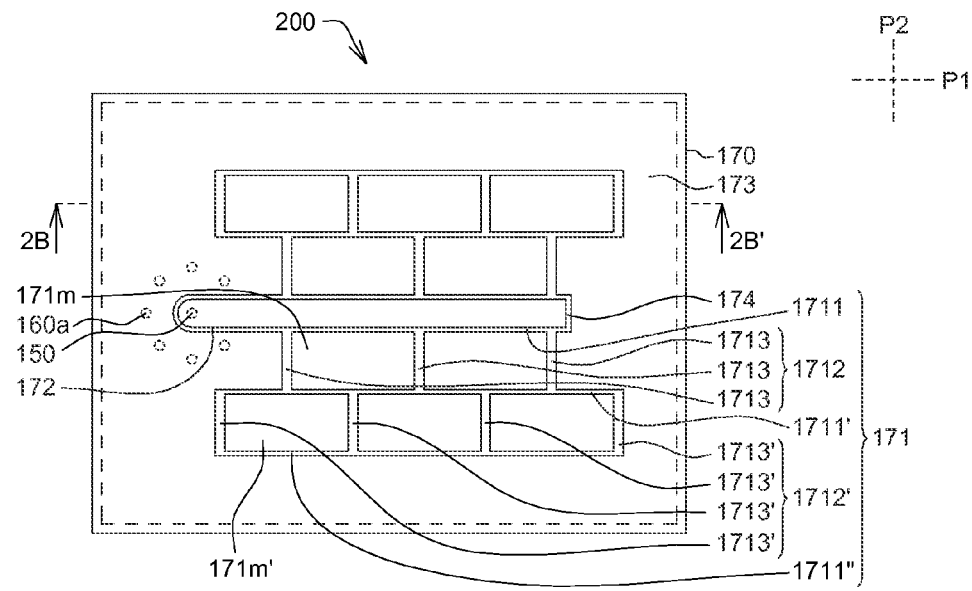
FIG. 2A illustrates a top view of an antenna layer of an example semiconductor package according to another embodiment.

Referring to FIG. 2A, a top view of an antenna layer of an example semiconductor package 200 according to another embodiment is illustrated. The antenna layer 170 includes two antenna slot groups, the antenna slot group 171 and its approximate mirror image connected together by an impedance matching slot 174. The antenna slot group 171 is described in detail, as the mirror image antenna slot group is similarly constructed.

The antenna slot group 171 includes a first wave guiding slot 1711, a first irradiation slot group 1712, a second wave guiding slot 1711', a second irradiation slot group 1712' and a third wave guiding slot 1711".

The first wave guiding slot 1711 extends along the first direction P1. The first irradiation slot group 1712 is connected to the first wave guiding slot 1711 and extends along the second direction P2. In one embodiment, the first irradiation slot group 1712 includes three irradiation slots 1713. In another embodiment, the number of irradiation slots 1713 in the first irradiation slot group 1712 may be one, two, or more than three.

The second wave guiding slot 1711' is connected to the first irradiation slot group 1712 and extends along the first direction P1.

A mesh in the antenna layer 170 including sections 171m is defined by the first wave guiding slot 1711, the irradiation slots 1713, and the second wave guiding slot 1711'. Long sides of the mesh are preferably formed by the first wave guiding slot 1711 or the second wave guiding slot 1711'. Short sides of the mesh are preferably formed by the irradiation slots 1713.

The second irradiation slot group 1712' is connected to the second wave guiding slot 1711' and extends along the second direction P2. The second irradiation slot group 1712' includes several irradiation slots 1713'. The number of the irradiation slots 1713' of the second irradiation slot group 1712' is more than the number of the irradiation slots 1713 in the first irradiation slot group 1712. The comparative number of the irradiation slots 1713 and the irradiation slots 1713' may be determined such that the energy radiated by the first irradiation slot group 1712 is substantially the same as the energy radiated by the second irradiation slot group 1712'.

The third wave guiding slot 1711" extends along the first direction P1 and is connected to the second irradiation slot group 1712'.

A mesh in the antenna layer 170 including sections 171m' is defined by the second wave guiding slot 1711', the irradiation slots 1713', and the third wave guiding slot 1711". Long sides of the mesh are preferably formed by the second wave guiding slot 1711' or the third wave guiding slot 1711". Short sides of the mesh are preferably formed by the irradiation slots 1713'.

Figure 2B:
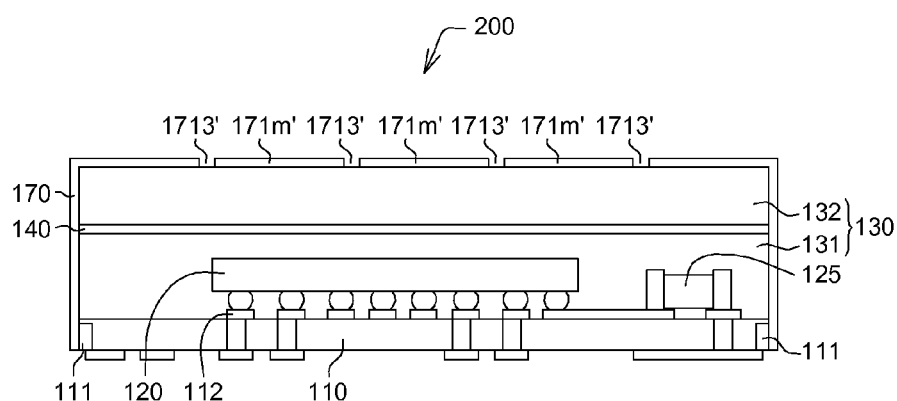
FIG. 2B illustrates a cross-sectional view along line 2B-2B' of the semiconductor package of FIG. 2A.

Referring to FIG. 2B, a cross-sectional view of FIG. 2A along line 2B-2B' is illustrated. The cross-section runs through irradiation slots of the mirror image antenna slot group, which are similar to the irradiation slots 1713' of the antenna slot group 171. A mesh in the antenna layer 170 is shown in the cross-section as the sections 171m' because of the similarity to the sections 171m' of the antenna slot group 171. The other features of the semiconductor package 200 are similar to features of the semiconductor package 100 of FIG. 1A, and the similar features are not described again.

Figure 3:
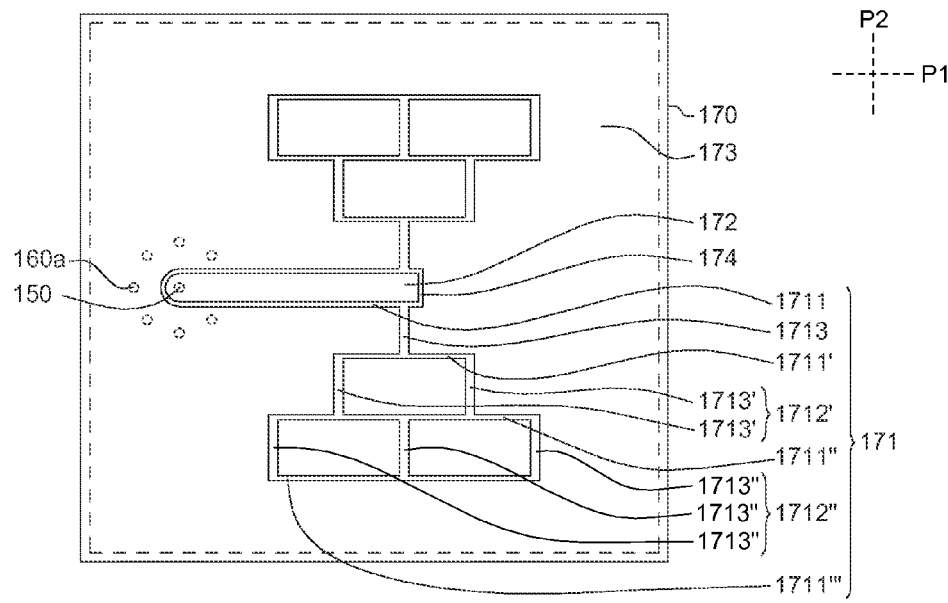
FIG. 3 illustrates a top view of an example antenna layer according to another embodiment.

Referring to FIG. 3, a top view of an antenna layer 170 according to another embodiment is illustrated. The antenna layer 170 includes two antenna slot groups 171, the antenna slot group 171 and its approximate mirror image, connected through an impedance matching slot 174. One slot group 171 is described in detail, and the other is substantially a mirror image of the slot group 171. The antenna slot group 171 includes a first wave guiding slot 1711, a first irradiation slot group, a second wave guiding slot 1711', a second irradiation slot group 1712', a third wave guiding slot 1711", a third irradiation slot group 1712" and a fourth wave guiding slot 1711'''.

The first irradiation slot group is illustrated as including one irradiation slot 1713; however, this is not meant to be limiting, the first irradiation slot group may instead include multiple irradiation slots 1713.

The second wave guiding slot 1711' extends along the first direction P1 and is connected to the first irradiation slot 1713.

The second irradiation slot group 1712' extends along the second direction P2 and is connected to the second wave guiding slot 1711'.

The third wave guiding slot 1711" extends along the first direction P1 and is connected to the second irradiation slot group 1712'.

The third irradiation slot group 1712" extends along the second direction P2 and is connected to the third wave guiding slot 1711".

The fourth wave guiding slot 1711''' extends along the first direction P1 and is connected to the third irradiation slot group 1712". In another embodiment, the fourth wave guiding slot 1711''' may be omitted.

For more uniform irradiation, the number of irradiation slots 1713' in the second irradiation slot group 1712' is more than the number of irradiation slots 1713 in the first irradiation slot group, and the number of irradiation slots 1713" in the third irradiation slot group 1712" is more than the number of irradiation slots 1713' in the second irradiation slot group 1712'.

The impedance matching slot 174 connects the first wave guiding slot 1711 of the antenna slot group 171. The sum of the length of the first wave guiding slot 1711 plus half of the length of the impedance matching slot 174 may be, for example, half of the wavelength of a mmWave signal. The length of the impedance matching slot 174 is a function of the impedance matching that may be desired for the antenna layer 170.

Figure 4:
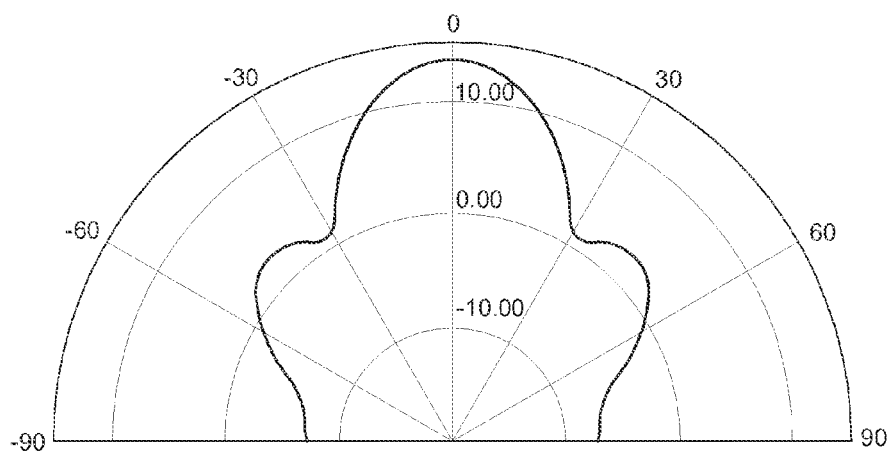
FIG. 4 illustrates a graph of the E plane in a field pattern of the antenna layer according to the embodiment of the antenna layer of FIG. 3.

Referring to FIG. 4, a graph illustrating the E plane of a field pattern of the antenna layer 170 of the semiconductor package of FIG. 3 is illustrated. The RF bandwidth radiated from the antenna layer 170 of FIG. 3 is in the range 57-64 GHz. At 60 GHz, the antenna layer 170 exhibits good directivity because the multiple irradiation slot groups (i.e., the first irradiation slot group, the second irradiation slot group 1712' and the third irradiation slot group 1712") increase the directivity of the antenna layer 170.

Figure 5A:
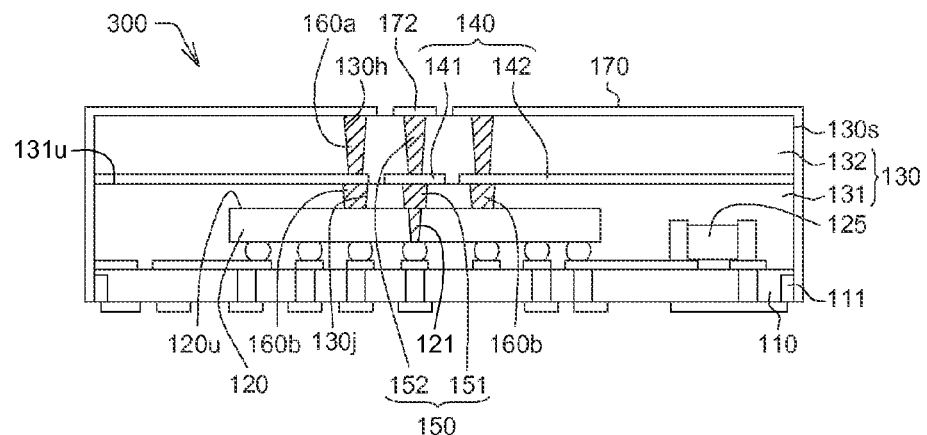
FIG. 5A illustrates a cross-sectional view of an example semiconductor package according to another embodiment.

Referring to FIG. 5A, a cross-sectional view of an example semiconductor package 300 according to one embodiment is illustrated. The semiconductor package 300 includes a substrate 110, a semiconductor chip 120, a package body 130, a shielding layer 140, a feeding element 150, conductive pillars 160a and 160b, and an antenna layer 170.

The semiconductor chip 120 includes a via 121 exposed from an upper surface 120u of the semiconductor chip 120.

The package body 130 includes a first package body portion 131 below the shielding layer 140, and a second package body portion 132 above the shielding layer 140.

The shielding layer 140 includes a feeding portion 141 and a shielding portion 142.

The feeding element 150 includes a first feeding portion 151 and a second feeding portion 152. The first feeding portion 151 extends from the feeding portion 141 to the via 121 of the semiconductor chip 120 to be electrically connected to the semiconductor chip 120. The second feeding portion 152 extends through the second package body portion 132 and is electrically connected to the shielding layer 140 and the antenna layer 170. In another embodiment, a portion of the first package body portion 131 covering the semiconductor chip 120 may be removed using grinding, such that the shielding layer 140 may be directly formed on the via 121 for electrical connection to the semiconductor chip 120. Accordingly, the first feeding portion 151 may be omitted such that an upper surface 131u of the first package body portion 131 is substantially coplanar with the upper surface 120u of the semiconductor chip 120.

Multiple conductive pillars 160a and 160b are formed within through holes 130h and 130j, respectively, which are formed in the package body 130 around the feeding element 150 to protect the feeding element 150 from electromagnetic interference (EMI).

Figure 5B:
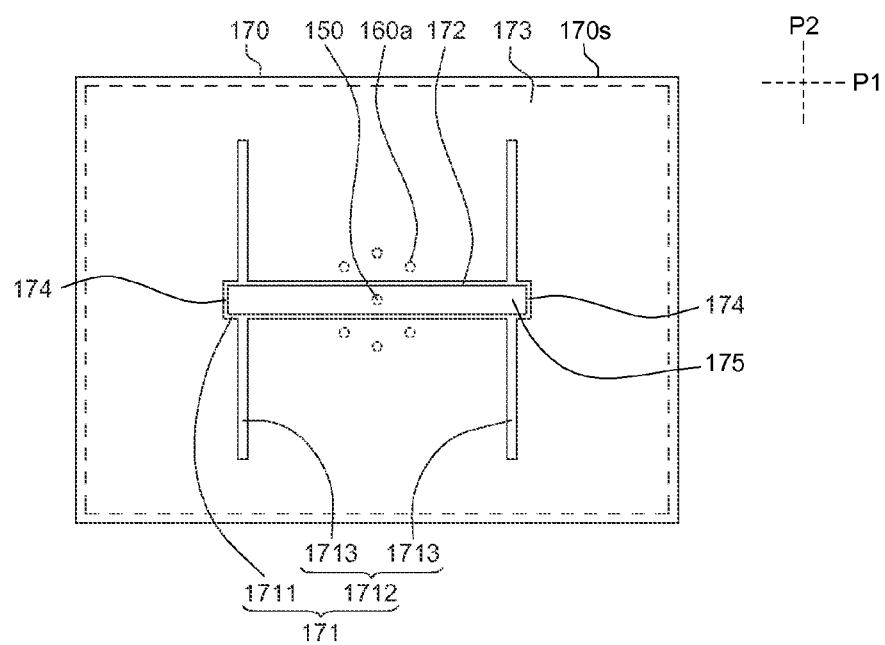
FIG. 5B illustrates a top view of the example of FIG. 5A.

Referring to FIG. 5B, a top view of FIG. 5A is illustrated. The antenna layer 170 includes two antenna slot groups connected to each other, an antenna slot group 171 and its substantially mirror image. Two impedance matching slots 174 connect the antenna slot group 171 with its mirror image. Antenna slot group 171 includes a wave guiding slot 1711 and an irradiation slot group 1712. The wave guiding slot 1711 extends along the first direction P1. The irradiation slot group 1712 is connected to the wave guiding slot 1711 and extends along the second direction P2. The irradiation slot group 1712 includes at least two irradiation slots 1713. The irradiation slots 1713 are shown as not extending to a lateral surface 170s of the antenna layer 170. However, in another embodiment, the irradiation slots 1713 may extend to the lateral surface 170s of the antenna layer 170. The irradiation slots 1713 may be connected perpendicularly to the wave guiding slot 1711 as illustrated, or, in another embodiment, may be slantwise connected to the wave guiding slot 1711. A slantwise connection lengthens the irradiation slots 1713 for radiating more energy of a mmWave signal.

As illustrated in FIG. 5B, an area 175 is formed in the antenna layer 170, defined by the wave guiding slot 1711 and its mirror image, along with the two impedance matching slots 174. The feeding element 150 is located at a middle position of the antenna layer 170. More specifically, the feeding element 150 is disposed in the center of the area 175.

Figure 6:
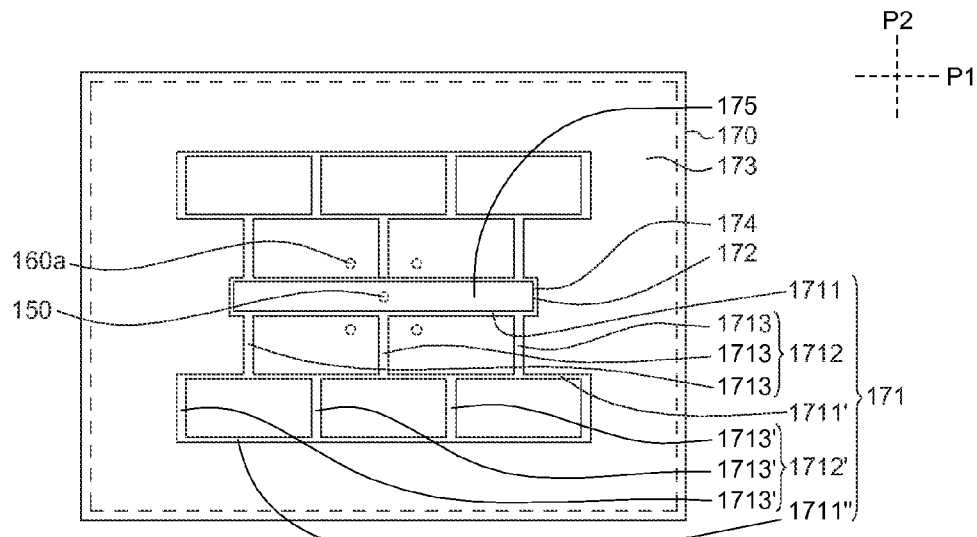
FIG. 6 illustrates a top view of an example semiconductor package according to another embodiment.

Referring to FIG. 6, a top view of a semiconductor package according to another embodiment is illustrated. The antenna layer 170 includes two antenna slot groups, an antenna slot group 171 and its substantially mirror image, connected together by two impedance matching slots 174. Antenna slot group 171 includes a first wave guiding slot 1711, a first irradiation slot group 1712, a second wave guiding slot 1711', a second irradiation slot group 1712' and a third wave guiding slot 1711". An area 175 defined by the impedance matching slots 174 and the first wave guiding slot 1711 with its mirror image is formed in the center of the antenna layer 170. The feeding element 150 is located at a middle position of the area 175.

As illustrated in FIG. 6, the first irradiation slot group 1712 includes multiple irradiation slots 1713. However, in another embodiment, the first irradiation slot group 1712 includes one irradiation slot 1713. To enhance irradiation, the number of irradiation slots 1713' in the second irradiation slot group 1712' is more than the number of irradiation slots 1713 in the first irradiation slot group 1712.

The third wave guiding slot 1711" may be omitted in some embodiments.

Figure 7:
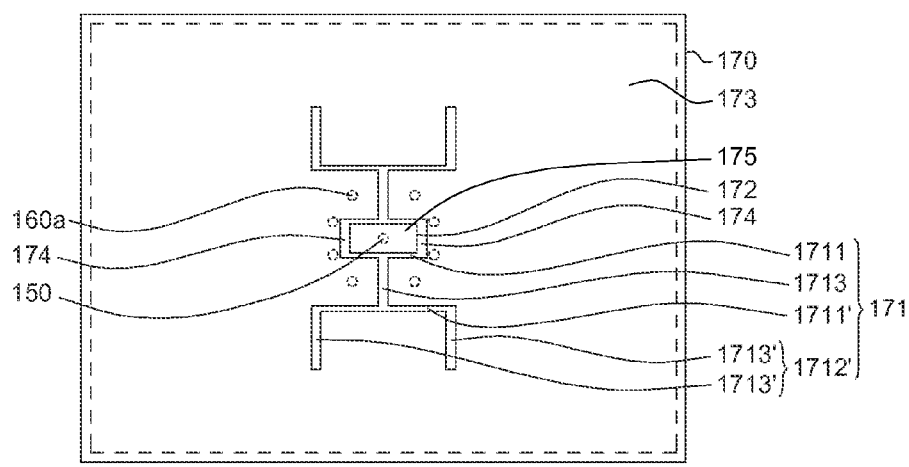
FIG. 7 illustrates a top view of an example semiconductor package according to another embodiment.

Referring to FIG. 7, a top view of an example semiconductor package according to another embodiment is illustrated. The antenna layer 170 includes two antenna slot groups, antenna slot group 171 and its substantially mirror image, connected together by two impedance matching slots 174. Antenna slot group 171 includes a first wave guiding slot 1711, a first irradiation slot group, a second wave guiding slot 1711' and a second irradiation slot group 1712'. The first irradiation slot group is illustrated as including one irradiation slot 1713. In other embodiments, the first irradiation slot group includes several irradiation slots 1713. For better irradiation, the number of irradiation slots 1713' in the second irradiation slot group 1712' is more than the number of irradiation slots 1713 in the first irradiation slot group.

As illustrated in FIG. 7, an area 175 is formed in the center of the antenna layer 170, defined by the first wave guiding slot 1711 and its mirror image and the two impedance matching slots 174. The feeding element 150 is located at a middle position of the area 175.

Figure 8:
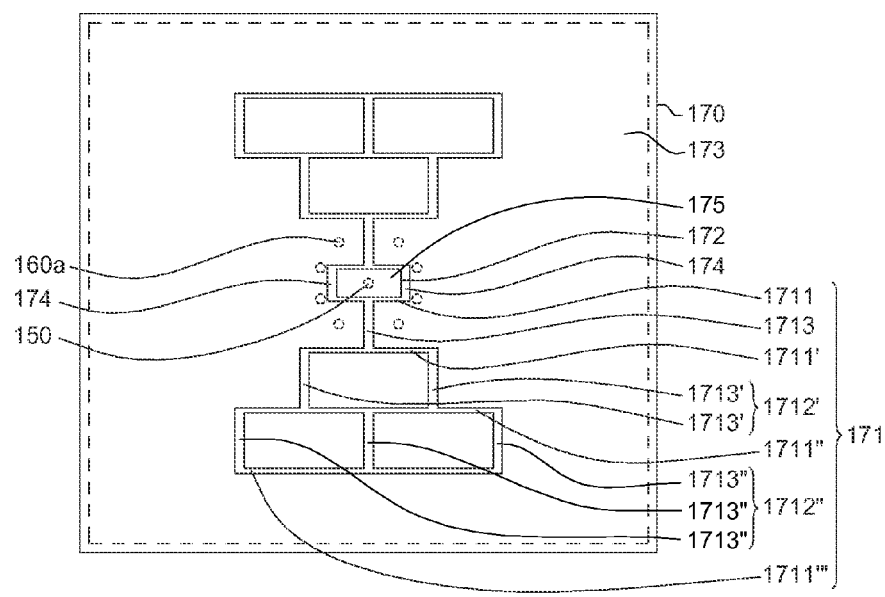
FIG. 8 illustrates a top view of an example semiconductor package according to another embodiment.

Referring to FIG. 8, a top view of a semiconductor package according to another embodiment is illustrated. The antenna layer 170 includes two antenna slot groups, antenna slot group 171 and its substantially mirror image, connected together by two impedance matching slots 174. Antenna slot group 171 includes a first wave guiding slot 1711, a first irradiation slot group, a second wave guiding slot 1711', a second irradiation slot group 1712', a third wave guiding slot 1711", a third irradiation slot group 1712" and a fourth wave guiding slot 1711'''.

As illustrated in FIG. 8, an area 175 is formed in the center of the antenna layer 170, defined by the first wave guiding slot 1711 and its mirror image, and the impedance matching slots 174. The feeding element 150 is located in the center of the area 175. The first irradiation slot group is illustrated as including one irradiation slot 1713. In other embodiments, the first irradiation slot group includes more than one irradiation slot 1713. For improved irradiation, the number of irradiation slots 1713' in the second irradiation slot group 1712' is more than the number of irradiation slots 1713 in the first irradiation slot group, and the number of irradiation slots 1713" in the third irradiation slot group 1712" is more than the number of irradiation slots 1713' in the second irradiation slot group 1712'.

Figure 9:
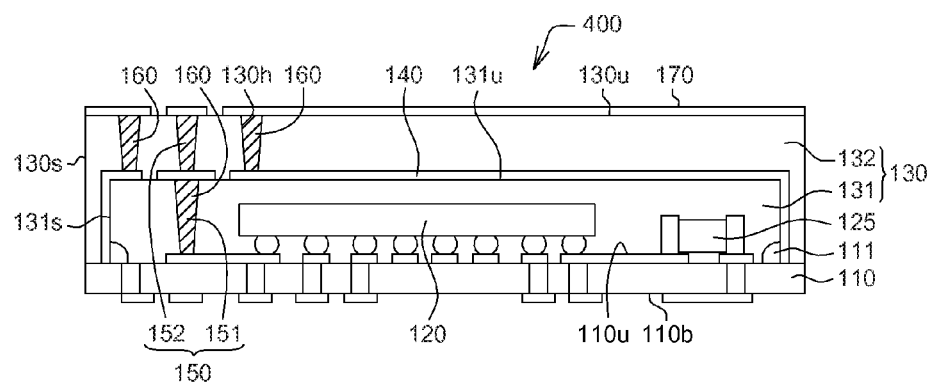
FIG. 9 illustrates a cross-sectional view of an example semiconductor package according to another embodiment.

Referring to FIG. 9, a cross-sectional view of a semiconductor package 400 according to another embodiment is illustrated. The semiconductor package 400 includes a substrate 110, a semiconductor chip 120, a package body 130, a shielding layer 140, a feeding element 150, conductive pillars 160 and an antenna layer 170.

The substrate 110 includes an upper surface 110u and a lower surface 110b opposite to the upper surface 110u, and further includes a grounding segment 111 which may extend from the upper surface 110u of the substrate 110. The package body 130 includes a first package body portion 131 and a second package body portion 132. The grounding segment 111 may be exposed from a lateral surface 131s of the first package body portion 131.

The shielding layer 140 is formed on an upper surface 131u of the first package body portion 131, the lateral surface 131s of the first package body portion 131 and the exposed grounding segment 111, wherein the first package body portion 131 encapsulates the semiconductor chip 120. The shielding layer 140 forms a conformal shielding to protect the semiconductor chip 120 from EMI. The second package body portion 132 is disposed on the upper surface 131u of the first package body portion 131, and covers a part of the shielding layer 140 and a portion of the upper surface 110u of the substrate 110. In the embodiment illustrated, the antenna layer 170 is formed on an upper surface 130u of the package body 130, but not formed on a lateral surface 130s of the package body 130.

Figure 10:
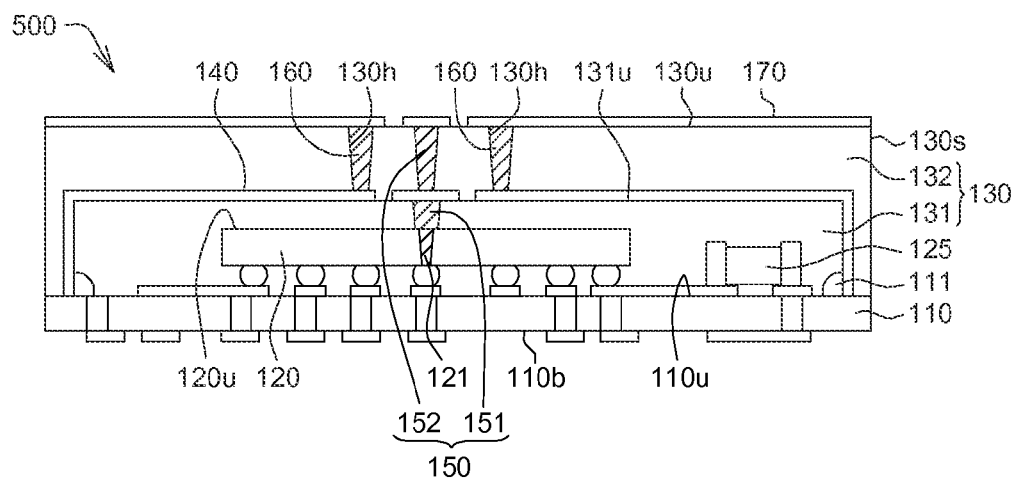
FIG. 10 illustrates a cross-sectional view of an example semiconductor package according to another embodiment.

Referring to FIG. 10, a cross-sectional view of an example semiconductor package 500 according to another embodiment is illustrated. The semiconductor package 500 includes a substrate 110, a semiconductor chip 120, a package body 130, a shielding layer 140, a feeding element 150, conductive pillars 160 and an antenna layer 170.

The feeding element 150 is formed in the package 130 and directly contacts a via 121 exposed from an upper surface 120u of the semiconductor chip 120. The conductive pillars 160 are formed within through holes 130h formed in the package body 130 and around the feeding element 150 to protect the feeding element 150 from EMI.

Figure 11:
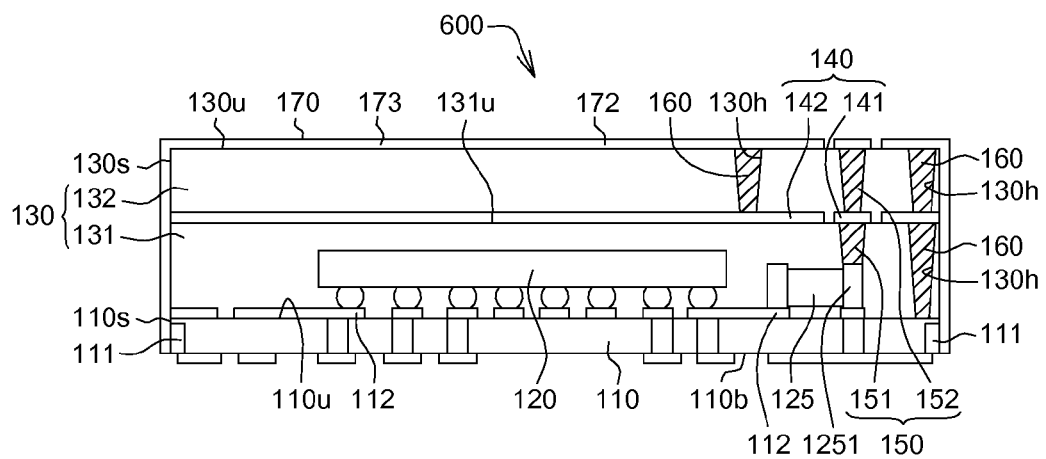
FIG. 11 illustrates a cross-sectional view of an example semiconductor package according to another embodiment.

Referring to FIG. 11, a cross-sectional view of an example semiconductor package 600 according to another embodiment is illustrated. The semiconductor package 600 includes a substrate 110, a semiconductor chip 120, a passive component 125, a package body 130, a shielding layer 140, a feeding element 150, multiple conductive pillars 160 and an antenna layer 170.

Through holes 130h, such as TMV, are formed in the package body 130 and extend to the shielding layer 140 from the antenna layer 170. The conductive pillars 160 are formed by filling the through holes 130h with conductive material. The conductive pillars 160 are electrically connected to grounding segment 111 through the antenna layer 170. Therefore, the conductive pillars 160 surrounding the feeding element 150 can protect a feeding signal transmitted by the feeding element 150 from EMI.

The feeding element 150 includes a first feeding portion 151 and a second feeding portion 152. The first feeding portion 151 extends through a first package body portion 131 of the package body 130 and electrically connects the shielding layer 140 and a terminal 1251 of the passive component 125. The passive component 125 is disposed on the upper surface 110u of the substrate 110 and may be electrically connected to the semiconductor chip 120 through a trace 112. Accordingly, the feeding element 150 may be electrically connected to the semiconductor chip 120. The second feeding portion 152 extends through a second package body portion 132 of package body 130 and is electrically connected to the shielding layer 140 and the antenna layer 170.

Referring to FIGS. 12A-12K, an embodiment of a manufacturing process according to the semiconductor package 100 of FIG. 1A is illustrated.

Figure 12A:
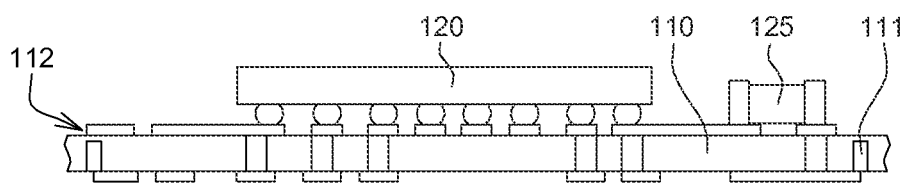
FIGS. 12A-12K illustrate an embodiment of a manufacturing process for the semiconductor package of FIG. 1A.

Referring to FIG. 12A, the semiconductor chip 120 and the passive component 125 are disposed on the substrate 110 by using surface mounting technology (SMT). The substrate 110 includes the grounding segment 111 and the traces 112. The substrate 110 is a strip including numerous package sites.

Figure 12B:
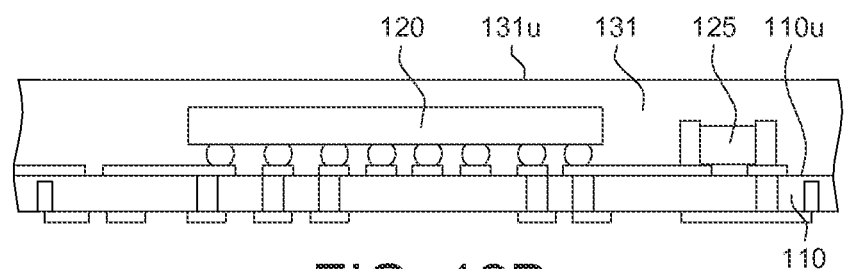

Referring to FIG. 12B, the first package body portion 131 is formed on an upper surface 110u of the substrate 110 to encapsulate the semiconductor chip 120 and the passive component 125. The first package body portion 131 includes an upper surface 131u.

Figure 12C:
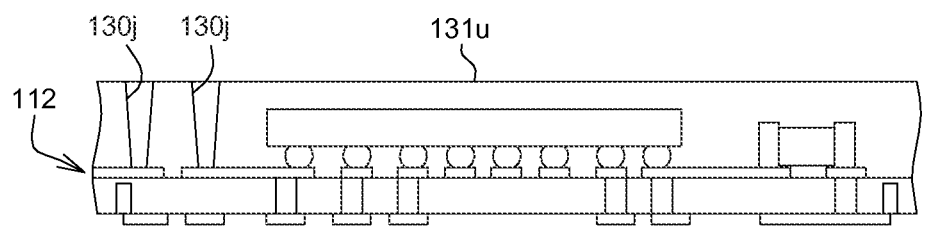

Referring to FIG. 12C, through holes 130j are formed using patterning technology to extend from the upper surface 131u to the traces 112 of the substrate 110. The patterning technology for forming the through holes 130j may be photolithography, chemical etching, laser drilling, or mechanical drilling, for example.

Figure 12D:
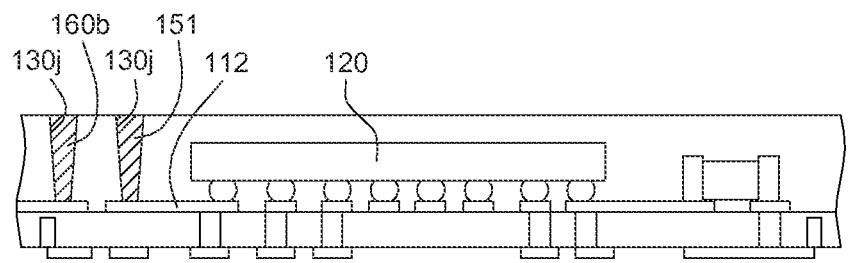

Referring to FIG. 12D, the first feeding portion 151 and the conductive pillars 160b are formed by filling the through holes 130j with conductive material by, for example, plating or applying solder paste.

Figure 12E:
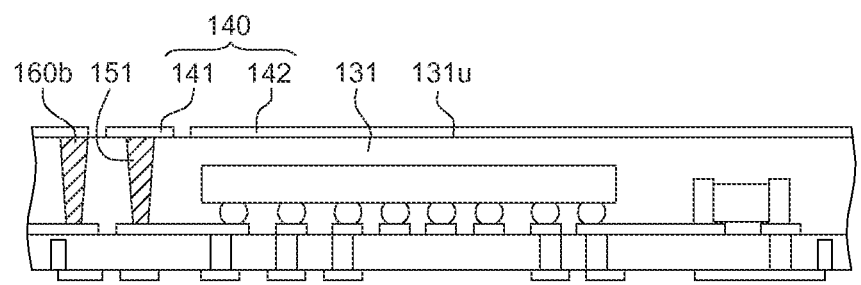

Referring to FIG. 12E, the shielding layer 140 covering the upper surface 131u is formed by using plating/etching photolithographic processes. The shielding layer 140 includes the feeding portion 141 and the shielding portion 142, wherein the feeding portion 141 is connected to the first feeding portion 151 and separated from the shielding portion 142, and the shielding portion 142 is connected to the conductive pillars 160b.

Figure 12F:
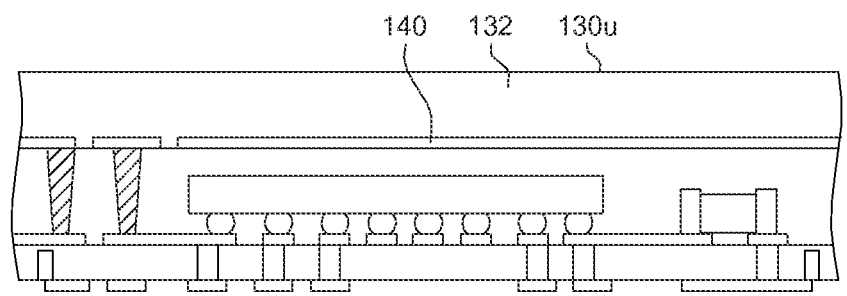

Referring to FIG. 12F, the second package body portion 132 is formed, covering the shielding layer 140. The second package body portion 132 includes an upper surface 130u.

Figure 12G:
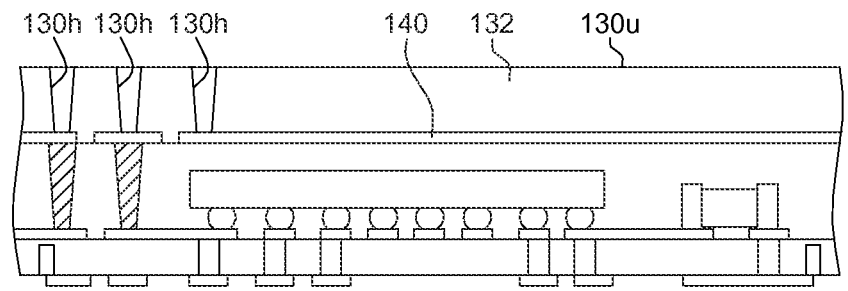

Referring to FIG. 12G, the through holes 130h are formed by using patterning technology, and extend from the upper surface 130u to the shielding layer 140. The patterning technology for forming the through holes 130h may be photolithography, chemical etching, laser drilling, or mechanical drilling, for example.

Figure 12H:
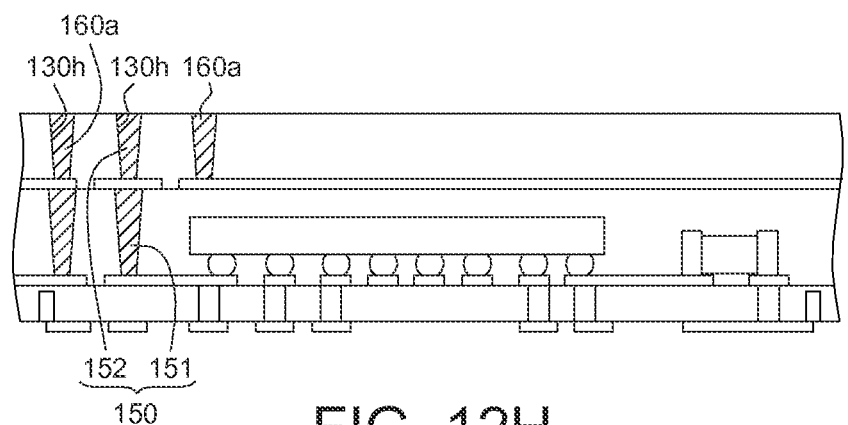

Referring to FIG. 12H, the second feeding portion 152 and the conductive pillars 160a are formed by filling the through holes 130h with conductive material by, for example, plating or applying solder paste. The first feeding portion 151 and the second feeding portion 152 together form the feeding element 150.

Figure 12I:
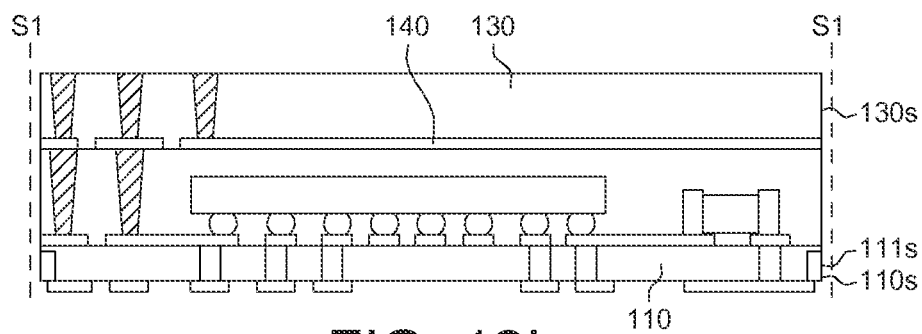

Referring to FIG. 12I, a number of singulation paths S1 passing through the package body 130, the shielding layer 140 and the grounding segment 111 are formed. The singulation paths S1 are formed using a laser or another cutting tool. The lateral surface 110s of the substrate 110, the lateral surfaces 130s of the package body 130 and the lateral surface 111s of the grounding segment 111 are formed, wherein the lateral surface 110s is substantially coplanar with the lateral surface 111s and the lateral surfaces 130s. The singulation method illustrated is referred to as a "full-cut method", that is, the singulation paths S1 cut substantially through the substrate 110, the grounding segment 111 and the package body 130.

Figure 12J:
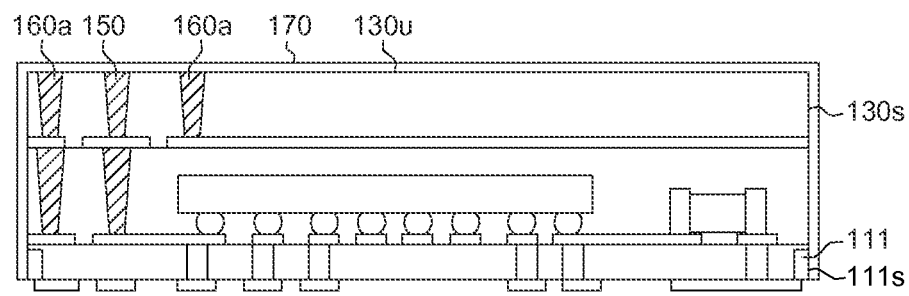

Referring to FIG. 12J, an antenna layer 170 covering the upper surface 130u of the package body 130, the lateral surface 130s of the package body 130 and the lateral surface 111s of the grounding segment 111 is formed by using plating/etching photolithographic processes. The antenna layer 170 is connected to the conductive pillars 160a and the grounding segment 111, such that the conductive pillars 160a are electrically connected to the grounding segment 111 through the shielding layer 140 and the antenna layer 170.

Figure 12K:
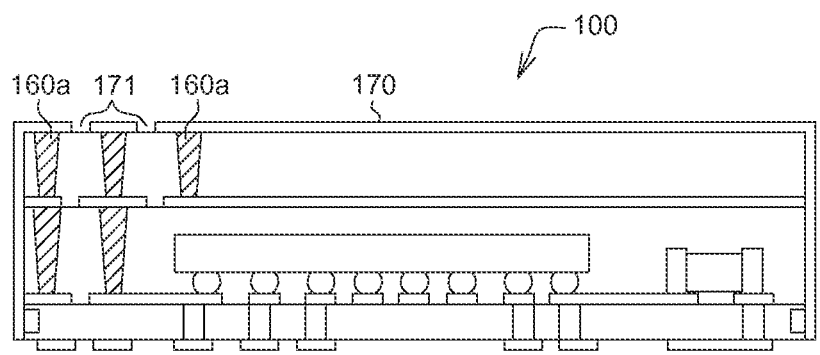

Referring to FIG. 12K, two antenna slot groups 171 are formed in the antenna layer 170 by using patterning technology so as to form the semiconductor package 100 illustrated in FIG. 1A.

Referring to FIGS. 13A-13F, an embodiment of a manufacturing process according to the semiconductor package 400 of FIG. 9 is illustrated. The process of forming the semiconductor package 400 of FIG. 9 is similar to that of forming the semiconductor package 100 of FIG. 1A, and similar features are generally not described again.

Figure 13A:
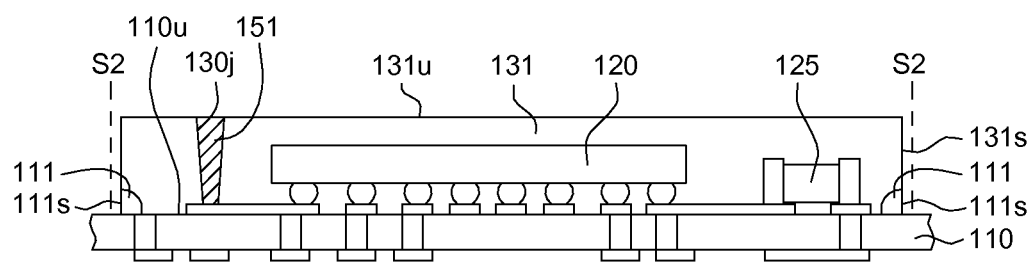
FIGS. 13A-13F illustrate an embodiment of a manufacturing process for the semiconductor package of FIG. 9.

Referring to FIG. 13A, the semiconductor chip 120 and the passive component 125 are disposed on the substrate 110 by using SMT, wherein the substrate 110 includes the grounding segment 111 extending from the upper surface 110u of the substrate 110. The first feeding portion 151 is formed by filling the through holes 130j in the first package body portion 131 with conductive material by, for example, plating or applying solder paste. The through holes 130j are formed by using patterning technology. The substrate 110 is a strip including numerous package sites.

A number of singulation paths S2 passing through the first package body portion 131 are formed using a laser or another cutting tool. The lateral surface 131s of the first package body portion 131 and the lateral surface 111s of the grounding segment 111 are formed by singulation. The singulation illustrated in FIG. 13A is referred as a "half-cut method", that is, the singulation paths S2 do not fully extend through the substrate 110.

Figure 13B:
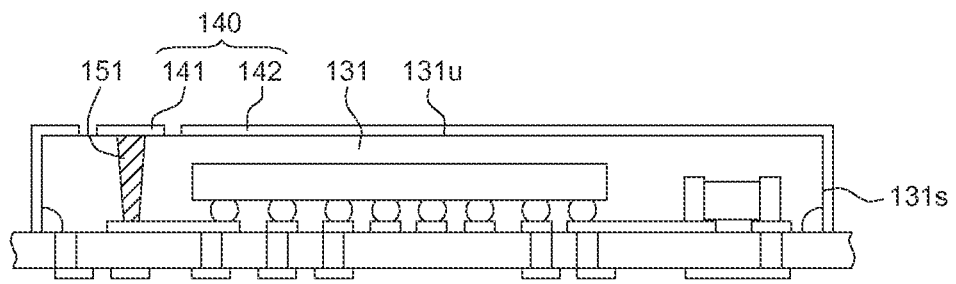

Referring to FIG. 13B, the shielding layer 140 covering the upper surface 131u and the lateral surface 131s of the first package body portion 131 is formed by using plating/etching photolithographic processes. The shielding layer 140 includes the feeding portion 141 and the shielding portion 142, wherein the feeding portion 141 is connected to the first feeding portion 151, and is separated from the shielding portion 142.

Figure 13C:
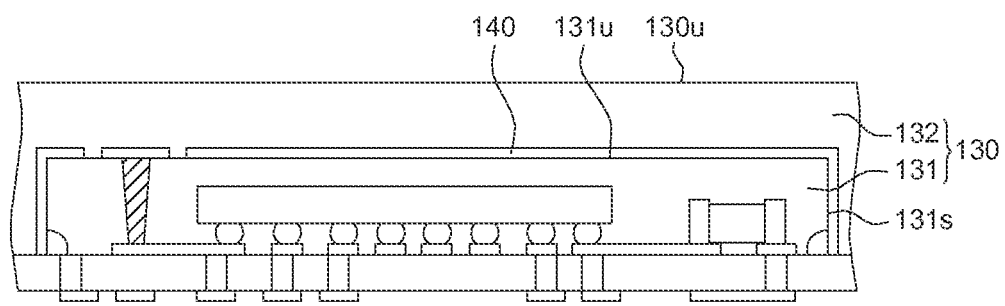

Referring to FIG. 13C, the second package body portion 132 covering the shielding layer 140 is formed, wherein the second package body portion 132 includes an upper surface 130u.

Figure 13D:
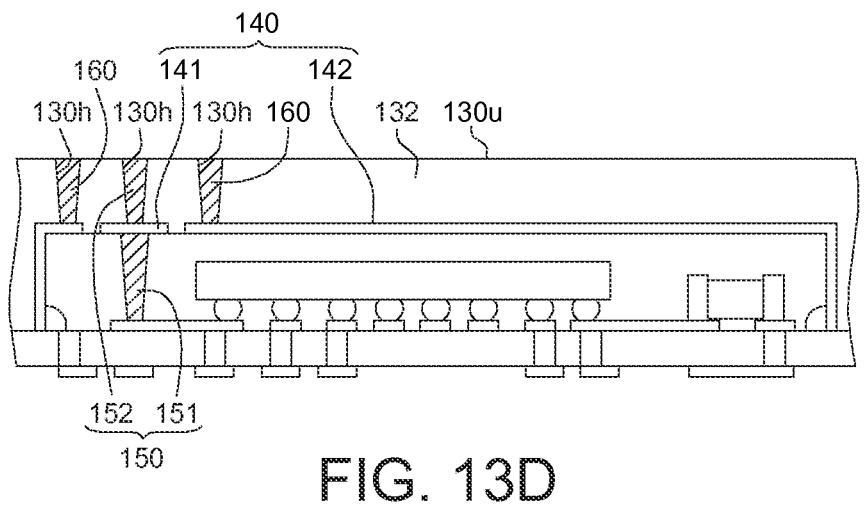

Referring to FIG. 13D, the through holes 130h extending from the upper surface 130u of the package body 130 to the shielding layer 140 are formed by using patterning technology. The patterning technology for forming the through holes 130h may be photolithography, chemical etching, laser drilling, or mechanical drilling, for example.

The second feeding portion 152 and the conductive pillars 160 are formed by filling the through holes 130h with conductive material by, for example plating or applying solder paste. The first feeding portion 151 and the second feeding portion 152 together form the feeding element 150.

Figure 13E:
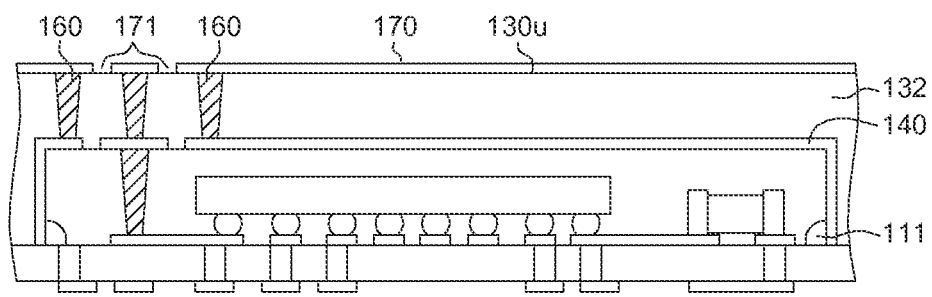

Referring to FIG. 13E, an antenna layer 170 covering the upper surface 130u is formed by using plating/etching photolithographic processes. The antenna layer 170 is connected to the conductive pillars 160, such that the antenna layer 170 is electrically connected to the grounding segment 111 through the conductive pillars 160 and the shielding layer 140.

Figure 13F:
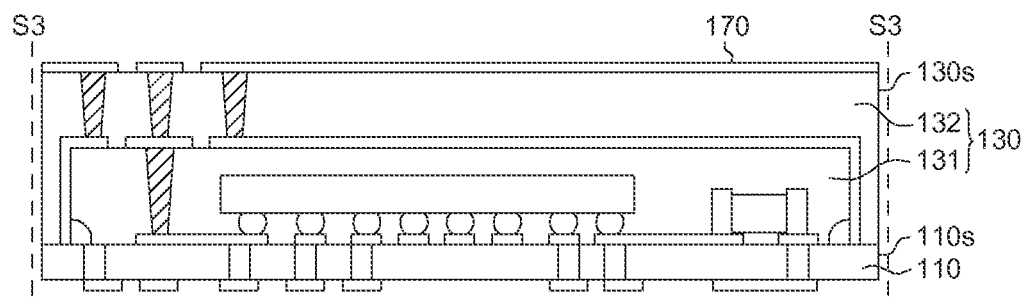

Referring to FIG. 13F, a number of singulation paths S3 are formed passing through the antenna layer 170, the second package body portion 132 and the substrate 110 so as to form the semiconductor package 400 illustrated in FIG. 9. The singulation paths S3 are formed using a laser or another cutting tool. The lateral surface 110s of the substrate 110 and the lateral surfaces 130s of the second package body portion 132 are substantially coplanar.

The methods of forming the semiconductor package 200 of FIG. 2B, the semiconductor package 300 of FIG. 5A, and the semiconductor package 600 of FIG. 11 are similar to that of forming the semiconductor package 100 of FIG. 1A, and thus not described again. The method of forming the semiconductor package 500 of FIG. 10 is similar to that of forming the semiconductor package 400 of FIG. 9, and thus not described again.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package comprising:
   a substrate;
   a semiconductor chip disposed on the substrate;
   a package body encapsulating the semiconductor chip and including an upper surface;
   an antenna layer formed on the upper surface of the package body, the antenna layer including two antenna slot groups connected together, wherein each antenna slot group includes a first wave guiding slot extending along a first direction, and a first irradiation slot group extending along a second direction, wherein the first irradiation slot group is connected to the first wave guiding slot.

2. The semiconductor package of claim 1, wherein the first irradiation slot group includes at least two irradiation slots.

3. The semiconductor package of claim 1, wherein the antenna layer further includes an impedance matching slot connecting the two antenna slot groups.

4. The semiconductor package of claim 1, wherein each antenna slot group further includes:
   a second wave guiding slot that extends along the first direction, wherein the first irradiation slot group is connected to the second wave guiding slot; and
   a second irradiation slot group connected to the second wave guiding slot and extending along the second direction.

5. The semiconductor package of claim 1, further comprising:
   a feeding element electrically connected to the semiconductor chip and located between the two antenna slot groups.

6. The semiconductor package of claim 5, wherein the substrate includes a grounding segment, the antenna layer includes a feeding layer and an irradiation layer, the feeding element is electrically connected to the feeding layer, and the irradiation layer is electrically connected to the grounding segment and separated from the feeding layer.

7. The semiconductor package of claim 6, wherein the package body includes a plurality of through holes surrounding the feeding element, the semiconductor package further comprising:
   a plurality of conductive pillars formed within the through holes and electrically connected to the grounding segment.

8. The semiconductor package of claim 5, wherein the feeding element is disposed on and in contact with an upper surface of the semiconductor chip.

9. The semiconductor package of claim 1, wherein the antenna layer extends to a lateral surface of the package body.

10. A semiconductor package, comprising:
    a substrate;
    a semiconductor chip disposed on the substrate;
    a first package body encapsulating the semiconductor chip;
    a second package body covering the first package body; and
    an antenna layer formed on the second package body, the antenna layer including two antenna slot groups, wherein each antenna slot group includes:
       a wave guiding slot; and
       an irradiation slot group connected to the wave guiding slot.

11. The semiconductor package of claim 10, wherein the first package body includes an upper surface, further comprising:
    a shielding layer formed on the upper surface of the first package body, wherein the shielding layer is covered by the second package body.

12. The semiconductor package of claim 11, further comprising:
    a feeding element including a first portion and a second portion, wherein the first portion electrically connects the shielding layer and the semiconductor chip; and the second portion electrically connects the shielding layer and the antenna layer.

13. The semiconductor package of claim 10, further comprising:
    a feeding element;
    a plurality of through holes in the second package body surrounding the feeding element; and
    a plurality of conductive pillars formed within the through holes and electrically connected to the antenna layer.

14. The semiconductor package of claim 10, further comprising a shielding layer formed on a lateral surface of the first package body.

15. The semiconductor package of claim 14, further comprising:
    a feeding element including a first portion and a second portion, wherein the first portion is electrically connected to the semiconductor chip through the first package body; and the second portion is electrically connected to the shielding layer and the antenna layer.

16. A semiconductor package comprising:
    a substrate;
    a semiconductor chip disposed on the substrate;
    a package body encapsulating the semiconductor chip and including an upper surface;
    an antenna layer formed on the upper surface of the package body, the antenna layer including two antenna slot groups connected together, wherein each antenna slot group includes at least one wave guiding slot extending along a first direction, and at least one irradiation slot group extending along a second direction, wherein each of the at least one irradiation slot group is connected to at least one of the at least one wave guiding slot.

17. The semiconductor package of claim 16, wherein the at least one wave guiding slot in a first of the two antenna slot groups comprises two wave guiding slots.

18. The semiconductor package of claim 16, wherein the at least one wave guiding slot in a first of the two antenna slot groups comprises three wave guiding slots.

19. The semiconductor package of claim 16, wherein the at least one wave guiding slot in a first of the two antenna slot groups comprises four wave guiding slots.

20. The semiconductor package of claim 16, wherein the at least one irradiation slot group in a first of the two antenna slot groups comprises two irradiation slot groups.

21. The semiconductor package of claim 16, wherein the at least one irradiation slot group in a first of the two antenna slot groups comprises three irradiation slot groups.

* * * * *